United States Patent
Vojnovic

(10) Patent No.: US 6,633,245 B1
(45) Date of Patent: Oct. 14, 2003

(54) METHOD AND SYSTEM FOR CORRECTING QUANTIZATION LOSS DURING ANALOG TO DIGITAL TO ANALOG SIGNAL CONVERSION

(75) Inventor: Mirko Vojnovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/318,656

(22) Filed: Dec. 12, 2002

(51) Int. Cl.⁷ ................................. H03M 2/00
(52) U.S. Cl. ................. 341/110; 341/118; 341/120; 341/144; 341/155
(58) Field of Search ................. 341/110, 118, 341/120, 144, 155

(56) References Cited

U.S. PATENT DOCUMENTS

| | | | | |
|---|---|---|---|---|
| 4,862,168 A | * | 8/1989 | Beard | 341/140 |
| 6,016,113 A | * | 1/2000 | Binder | 341/131 |
| 6,016,327 A | * | 1/2000 | Kaplan | 375/243 |
| 2002/0118219 A1 | * | 8/2002 | Nally et al. | 345/660 |

* cited by examiner

Primary Examiner—Michael Tokar
Assistant Examiner—Khai Nguyen
(74) Attorney, Agent, or Firm—Sawyer Law Group, LLP

(57) ABSTRACT

A method and system for correcting quantization loss of a signal during analog to digital to analog signal conversion, wherein the quantization loss is a function of $(\sin x)/x$, is disclosed. The system and method of the present invention includes utilizing a continuous function polynomial to represent a $(\sin x)/x$ function, and applying an inverse function of the continuous function polynomial to the signal to provide a correction for the quantization loss.

12 Claims, 3 Drawing Sheets

METHOD AND SYSTEM FOR CORRECTING QUANTIZATION LOSS DURING ANALOG TO DIGITAL TO ANALOG SIGNAL CONVERSION

FIELD OF THE INVENTION

The present invention relates to analog to digital to analog signal conversion, and more particularly to correcting quantization loss during such a conversion.

BACKGROUND OF THE INVENTION

FIG. 1 is a block diagram illustrating a conventional analog to digital to analog signal conversion system 10. As is shown, an analog signal 20 is inputted into an analog to digital converter 12, where the analog signal is converted into a digital discrete time signal 22. A digital system 14 utilizes the digital signal 22 in such a manner that is well known to those skilled in the art, e.g., for storage, delay, etc., and is not germane to the present invention. The digital discrete time signal 22 is converted back into a reconstructed analog signal 24 by a digital to analog converter 16. The resulting reconstructed analog signal 24 can be passed through a low pass filter 18 to filter out quantization noise before the signal 24 is finally outputted as an analog signal 26.

Ideally, the analog signal out 26 is identical to the analog signal in 20. Quantization losses, however, inherently occur during the conversion process. In particular, quantization losses occur when the analog signal 24 is being reconstructed from the digital discrete time signal 22. This quantization loss is known as a "(sin X)/x loss," and is reflected as a diminished energy amplitude for the signal.

The (sin x)/x loss is a function of how often the digital signal 22 is sampled in order to reconstruct the analog signal in 20. At lower frequency bandwidths of the digital signal 22, it is not difficult to select a sampling frequency that allows the digital to analog converter 16 to collect enough data points to accurately reconstruct the analog signal in 20. Thus, at lower frequency bandwidths, the quantization loss is negligible.

At higher frequency bandwidths, however, the sampling frequency is not high enough to accurately capture the true nature of the signal. For instance, if the sampling frequency is only twice the upper frequency of the high frequency bandwidth, the converter 16 will attempt to reproduce the upper frequency based on only two sampled data points. The converter 16 can only estimate the nature of the signal between the two points, and oftentimes underestimates the amplitude peak of the signal. Consequently, the quantization loss can be significant and the high frequency bandwidth of analog signal out 26 will not be an accurate reproduction of the same bandwidth of the analog signal in 20.

Accordingly what is needed is a system and method for correcting quantization loss during analog to digital to analog signal conversion. The system and method should provide an acceptable degree of accuracy of correction, but not require excessive processing power. The present invention addresses such a need.

SUMMARY OF THE INVENTION

The present invention provides a method and system for correcting quantization loss of a signal during analog to digital to analog signal conversion, wherein the quantization loss is a function of (sin x)/x. The system and method of the present invention includes utilizing a continuous function polynomial to represent a (sin x)/x function, and applying an inverse function of the continuous function polynomial to the signal to provide a correction for the quantization loss.

By utilizing a continuous function polynomial, such as McLaurin's polynomial, to represent the (sin x)/x function, the correction for the quantization loss can be calculated quickly and easily, thereby expending little processing power. Moreover, a filter that creates an inverse function of the continuous function polynomial leaves a small footprint because it does not require significant hardware resources. If a sampling frequency is at least four times an upper frequency of a desired frequency bandwidth, only the first two members of the polynomial need be used to accurately approximate the quantization loss. Accordingly, under these conditions, the correction is accurately provided by creating an inverse function of only the first two members of the polynomial.

DETAILED DESCRIPTION

The present invention relates to a method and system for correcting quantization loss during analog to digital to analog signal conversion. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

As discussed above, the quantization loss of a signal is a function of the sampling frequency. In particular, the quantization loss is represented by the formula:

Quantization Loss $(dB)=20 \log [(\sin x)/x]$ where, $x=\pi(F_v/F_r)$. $F_v$ is defined as the frequency of interest, which is generally the highest frequency of a particular signal bandwidth, and $F_s$ is defined as the sampling frequency. (IEEE Std 746–1984). When the ratio $F_v/F_s$ approaches zero, i.e., the sampling frequency is much larger than the frequency of interest, the loss is negligible. Nevertheless, as the ratio $F_v/F_s$ approaches 0.50, i.e., as the frequency of interest approaches one-half the sampling frequency (Nyquist's criteria), the quantization loss becomes so significant that reproduction of the high frequency bandwidth is difficult without some correction mechanism.

Figure 1:
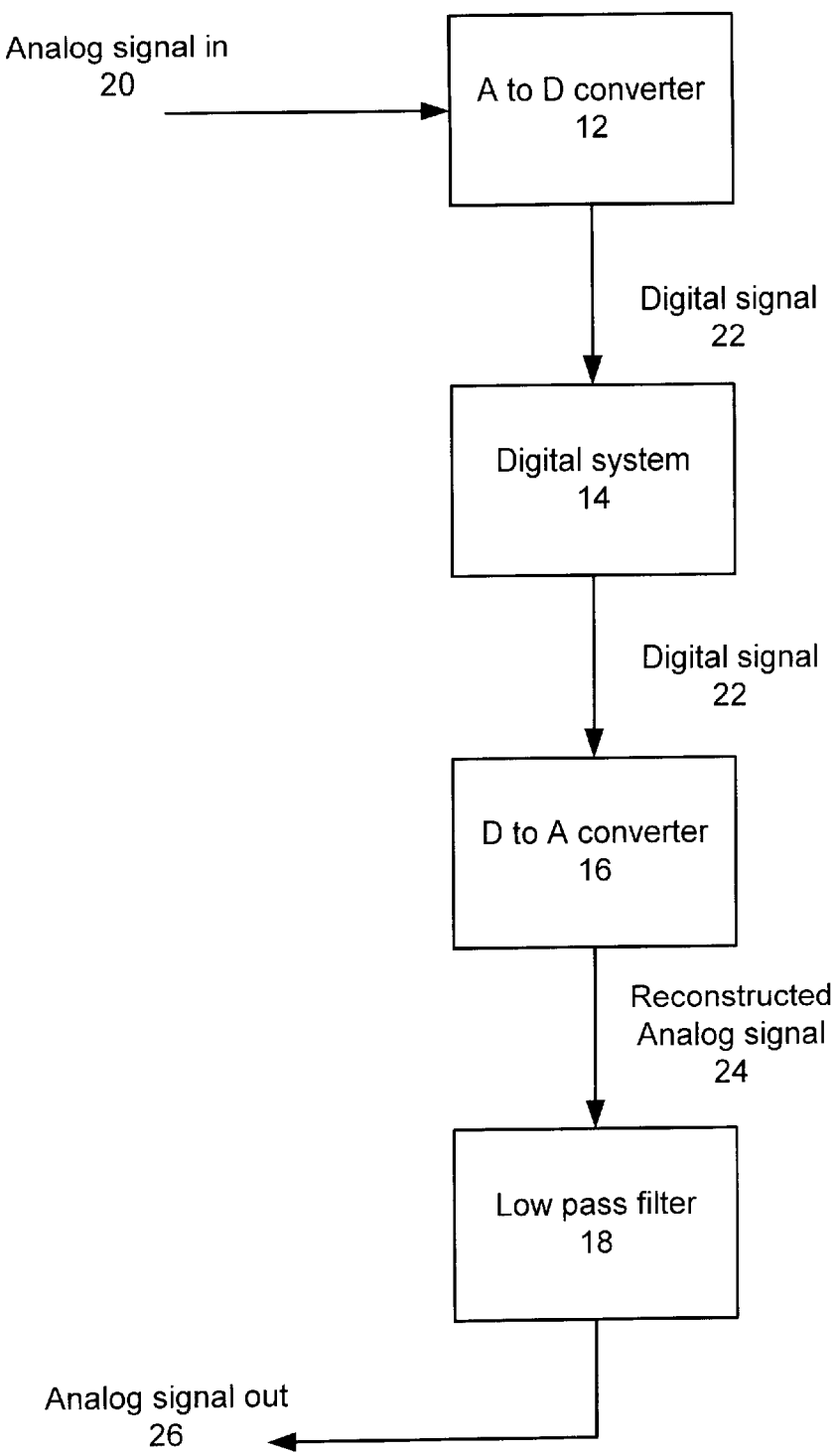
FIG. 1 is a block diagram illustrating a conventional conversion system.
Figure 2:
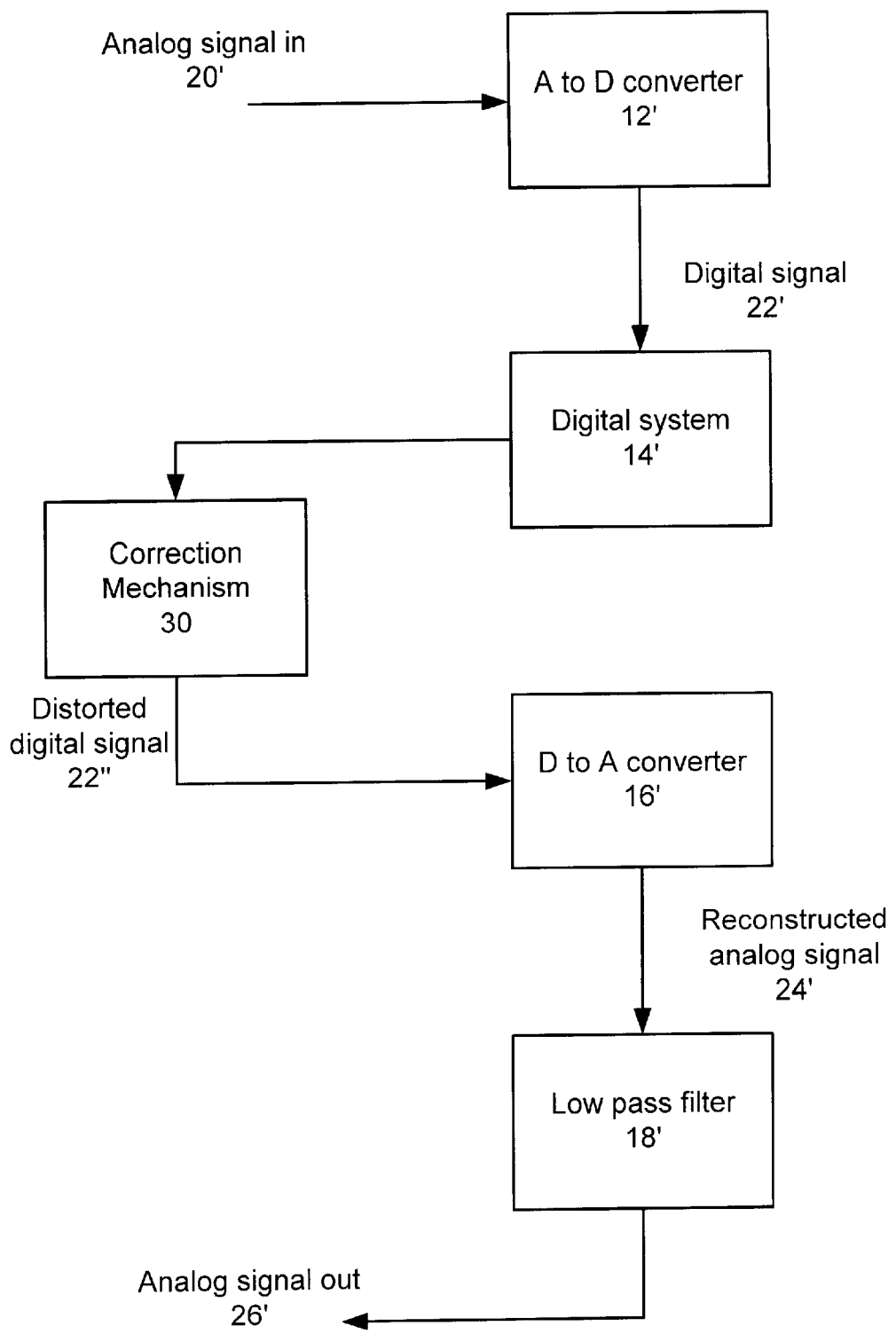
FIG. 2 is a block diagram illustrating a system that can be used in a preferred embodiment of the present invention.

FIG. 2 is a block diagram illustrating an analog-digital-analog conversion system 10' which can be utilized by the preferred embodiment of the present invention. As is shown, the digital signal 22' passes through a correction mechanism 30 before the signal 22' is converted back into an analog signal 24'. The correction mechanism 30 distorts the digital signal 22' to compensate for the quantization losses which will occur during digital to analog conversion. When the distorted digital signal 22'' is converted, the resulting reconstructed analog signal 24' will not exhibit quantization losses, but rather, it will reflect accurately the incoming analog signal 20'.

The distortion directly offsets the quantization losses at a particular signal frequency and sampling frequency. Because the quantization loss is a function of (sin x)/x, the distortion is determined by an inverse (sin x)/x function. Accordingly, the correction mechanism 30 can provide the appropriate distortion to the digital signal 22' by implementing a filter to create an inverse (sin x)/x function. While this is straightforward in principle, in practice, it requires significant hardware resources to implement such a filter. At a time when computer chips are becoming smaller and smaller, the footprint of such a filter is detrimental. Moreover, the calculation requires significant processing power and time, which adversely impacts performance.

The method and system of the present invention takes another approach for approximating the quantization loss at a given frequency of interest and sampling frequency. Because (sin x)/x is a continuous function, it can be represented by a mathematical formula in the form of a finite polynomial.

Figure 3:
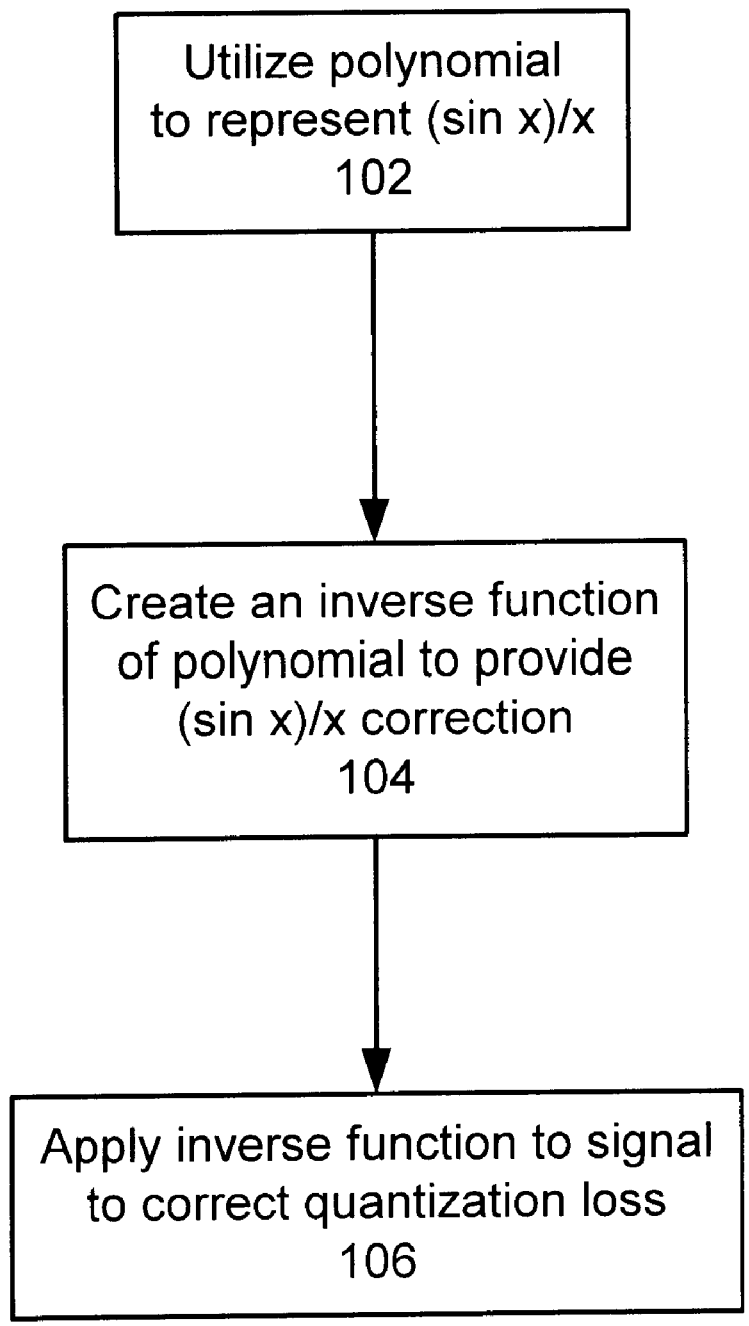
FIG. 3 is a flowchart illustrating a process for correcting quantization losses.

FIG. 3 is a flowchart illustrating a process for correcting quantization losses according to a preferred embodiment of the present invention. In step 102, the (sin x)/x function is represented by a continuous function polynomial. Then, in step 104, the correction mechanism 30 implements a filter that creates an inverse function of the continuous function polynomial in order to provide the (sin x)/x correction. The inverse function is then applied to the signal, in step 106, to correct for quantization losses.

In a preferred embodiment, the continuous function polynomial is a McLaurin's polynomial of the form:

$$(\sin x)/x = 1 - (x^2/3!) + (x^4/5!) - (x^6/7!) + \ldots$$

where $x = \pi(F_v/F_s)$. After substituting $\pi$ and calculating factorials, the formula simplifies to:

$$(\sin x)/x = 1 - 1.64f^2 + 0.81f^4 - 0.19f^6 + \ldots$$

where $f = F_v/F_s$.

By calculating the first few members of the continuous function polynomial, the quantization loss can be approximated accurately and easily for a given frequency of interest and sampling frequency. Moreover, if the sampling frequency is much larger than the frequency of interest, e.g., the sampling frequency is at least four times the frequency of interest, then the quantization loss is accurately derived (to within 0.5%) using only the first two members of the polynomial. Thus, for $f \leq 0.25$, the approximation for (sin x)/x simplifies to:

$$(\sin x)/x = 1 - 1.64f^2$$

which ensures accuracy to within 0.5%.

In the preferred embodiment of the present invention, the correction mechanism 30 implements a filter that creates an inverse function of the first two members of the continuous function polynomial, instead of creating an inverse (sin x)/x function, to correct the quantization loss. Because the simplified polynomial is far less complicated than the (sin x)/x function, implementation of the inverse function requires less hardware resources. Moreover, by using the first few members of the continuous function polynomial to approximate (sin x)/x, quantization losses can be calculated quickly, thereby reducing processing time and resources. Thus, the preferred embodiment of the present invention provides a small footprint and high performance along with conversion accuracy.

The present invention has been described in accordance with the embodiments shown, and one of ordinary skill in the art will readily recognize that there could be variations to the embodiments. For example, although correction is preferably performed before the digital signal 22' is converted back to an analog signal, those skilled in the art would readily appreciate that correction could also be performed after digital to analog conversion. Any variations would be within the spirit and scope of the present invention. Accordingly, many modifications may be made by one of ordinary skill in the art without departing from the spirit and scope of the appended claims.

What is claimed is:

1. A method for correcting quantization loss of a signal during analog to digital to analog signal conversion, wherein the quantization loss is a function of (sin x)/x, the method comprising the steps of:

(a) utilizing a continuous function polynomial to represent a (sin x)/x function; and (b) applying an inverse function of the continuous function polynomial to the signal to provide a correction for the quantization loss.

2. The method of claim 1, wherein the continuous function polynomial is a McLaurin's polynomial.

3. The method of claim 2, wherein x is the product of $\pi$ and the ratio between a frequency of the signal and a sampling frequency.

4. The method of claim 3, further including the step of:

(c) selecting the sampling frequency to be at least four times the frequency of the signal, wherein the frequency of the signal is a frequency at an upper limit of a desired bandwidth.

5. The method of claim 4, wherein the creating step (b) further includes:

(b) providing an inverse function of a first member and a second member of the McLaurin's polynomial.

6. A system for correcting quantization loss of a signal during analog to digital to analog signal conversion, wherein the quantization loss is a function of (sin x)/x, comprising:

a correction mechanism for receiving an uncorrected signal;

a filter in the correction mechanism for creating an inverse function of a continuous function polynomial representing a (sin x)/x function; and means for applying the inverse function to the signal to provide a correction for the quantization loss.

7. The system of claim 6, wherein the continuous function polynomial is a McLaurin's polynomial.

8. The system of claim 7, wherein x is the product of $\pi$ and the ratio between a frequency of the signal and a sampling frequency.

9. The system of claim 8, wherein the sampling frequency is at least four times the signal frequency, wherein the signal frequency is a frequency at an upper limit of a desired bandwidth.

10. The system of claim 9, wherein the filter creates an inverse function of a first member and a second member of the McLaurin's polynomial.

11. The system of claim 6, wherein the uncorrected signal is a digital signal.

12. The system of claim 6, wherein the uncorrected signal is a reconstructed analog signal.

* * * * *